United States Patent [19]

Okajima et al.

[11] Patent Number: 5,382,901
[45] Date of Patent: Jan. 17, 1995

[54] OPTICAL MAGNETIC FIELD SENSOR CAPABLE OF PRECISE MEASUREMENT WITHOUT TEMPERATURE INDUCED ERRORS

[75] Inventors: Hisakazu Okajima, Nishikasugai; Masaki Noda, Nagoya, both of Japan

[73] Assignee: NGK Insulators, Ltd., Japan

[21] Appl. No.: 12,843

[22] Filed: Feb. 2, 1993

[30] Foreign Application Priority Data

Aug. 29, 1991 [JP] Japan .................. 3-242386
Feb. 21, 1992 [JP] Japan .................. 4-035037

[51] Int. Cl.⁶ .............. G01R 31/00; G01R 33/02; G02B 5/30
[52] U.S. Cl. ............... 324/244.1; 324/96; 250/225
[58] Field of Search ......... 324/244.1, 96, 117 R, 324/225, 72, 72.5, 260, 262; 359/280, 283, 322, 324; 250/231.1, 227.14, 225; 356/374–378, 368, 364, 72

[56] References Cited

U.S. PATENT DOCUMENTS

| | | | |
|---|---|---|---|
| 4,531,092 | 7/1985 | Shibano | 324/96 |
| 4,581,579 | 4/1986 | Nagatsuma et al. | 324/244.1 |
| 4,973,899 | 11/1990 | Jones et al. | 324/244.1 |

FOREIGN PATENT DOCUMENTS

| | | | |
|---|---|---|---|
| 0390581A3 | 10/1990 | European Pat. Off. | |
| 0410234A3 | 1/1991 | European Pat. Off. | |
| 59-159076 | 8/1984 | Japan | 324/244.1 |
| 60-104270 | 6/1985 | Japan | 324/244.1 |
| 60-138480 | 7/1985 | Japan | 324/244.1 |
| 61-82179 | 4/1986 | Japan | |

OTHER PUBLICATIONS

IEEE Trans. on Power Delivery, vol. 2, No. 1, Jan. 1987, US pp. 87–93, T. Mitsui et al. "Development of Fiber–Optic Voltage Sensors and Magnetic–Field Sensors."

IEEE Trans. on Power Delivery, vol. 5, No. 2, Apr. 1990, US pp. 892–898, E. A. Ulmer, "A High–Accuracy Optical Current Transducer for Electric Power Systems."

Applied Optics, vol. 28, No. 11, Jun. 1989, New York US, pp. 2001–2011, K. S. Lee "New Compensation Method for Bulk Optical Sensors with Multiple Birefringences".

Primary Examiner—Kenneth A. Wieder
Assistant Examiner—J. M. Patidar
Attorney, Agent, or Firm—Parkhurst, Wendel & Rossi

[57] ABSTRACT

An optical magnetic field sensor is provided that can precisely measure a magnetic field strength without measuremental errors caused by temperature change. The sensor includes a light source, a polarizer, a Faraday's element, an analyzer, a first light beam-receiving element, a first calculation circuit, a second light beam-receiving element, a second calculation circuit, and a third calculation circuit, wherein the light beam emitted from the light source is passed through the polarizer, the Faraday's element and the analyzer in sequence, an S polarized light beam after passed through the analyzer is passed through the first light beam-receiving element, an output signal therefrom is calculated in the first calculation circuit, a P polarized light beam after passed through the analyzer is passed through the second light beam-receiving element, an output signal therefrom is calculated in the second calculation circuit, the third calculation circuit is supplied with the outputs $V_{11}$ and $V_{22}$ from the first and second calculation circuits respectively to obtain an output $V_3$ based on specific equations, and a magnetic field strength is obtained from the output $V_3$ of the third calculation circuit.

2 Claims, 4 Drawing Sheets

FIG_1
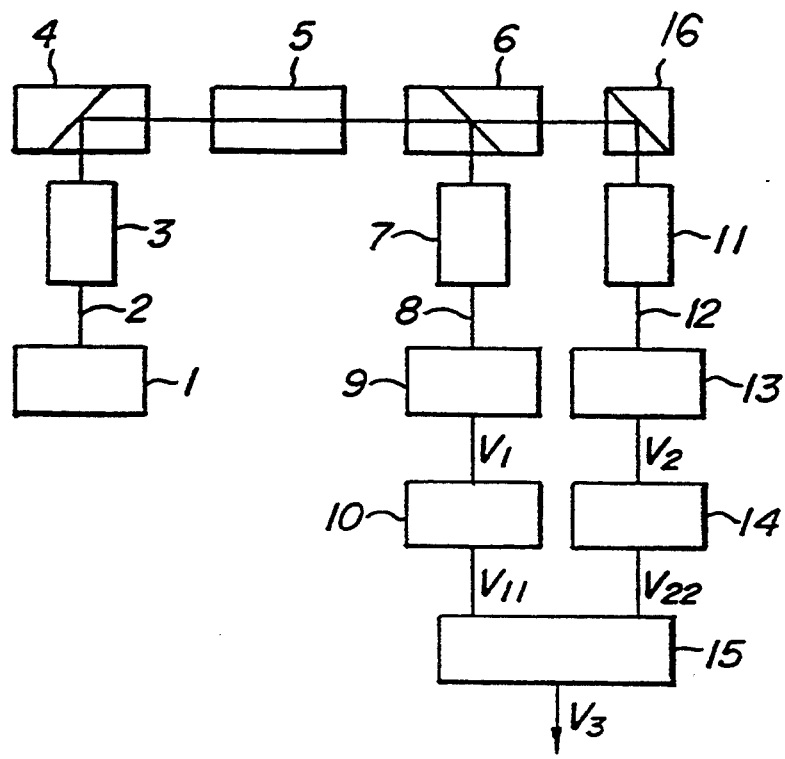
FIG_2
PRIOR ART
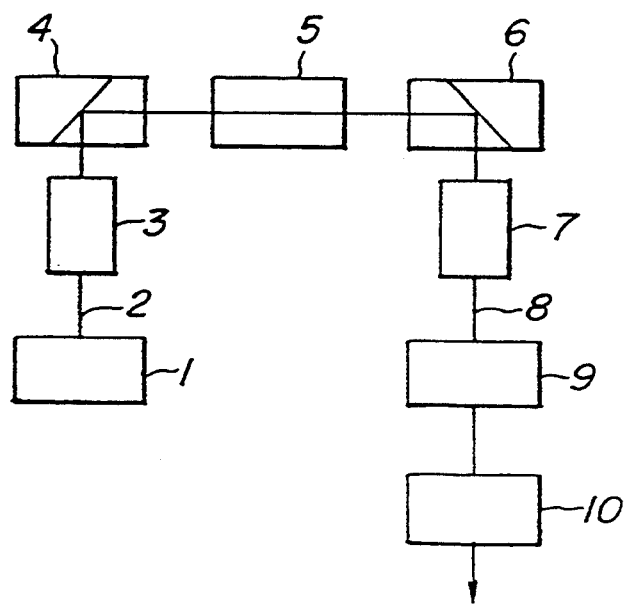

FIG_3a
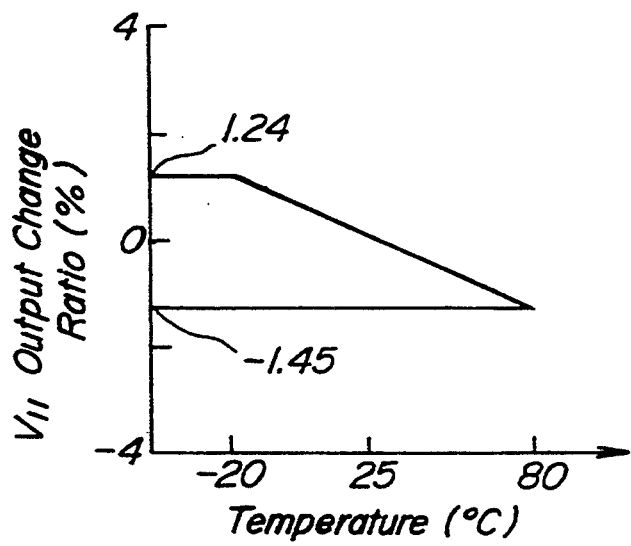
FIG_3b
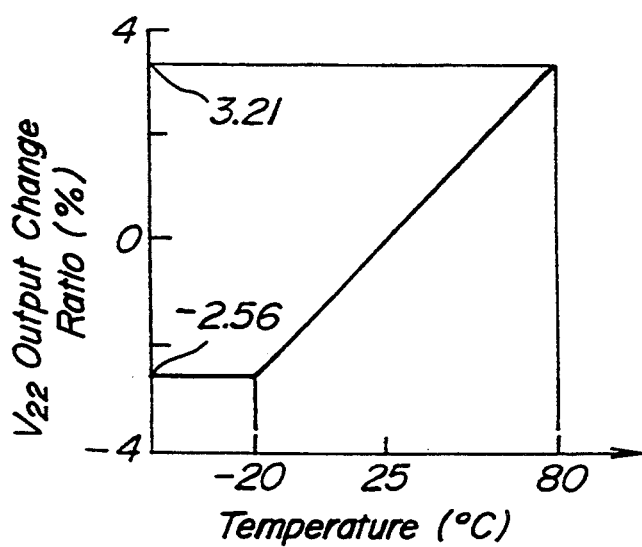
FIG_3c
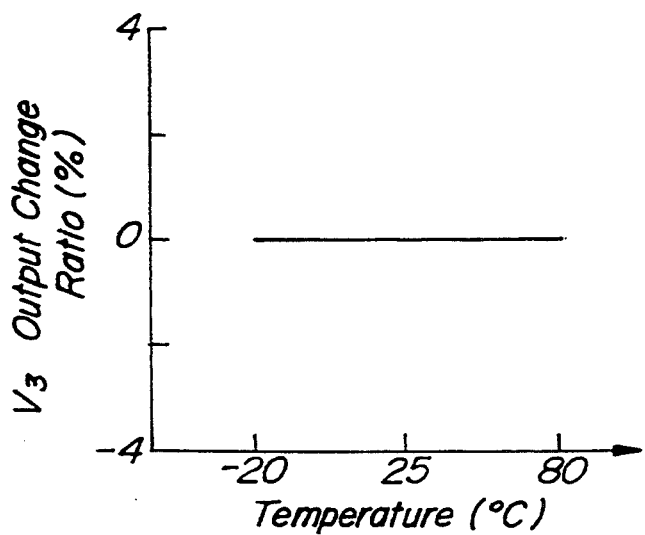

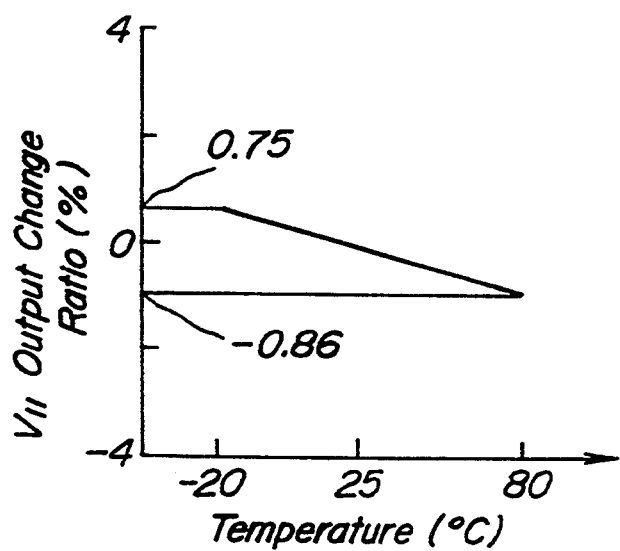
FIG._4a
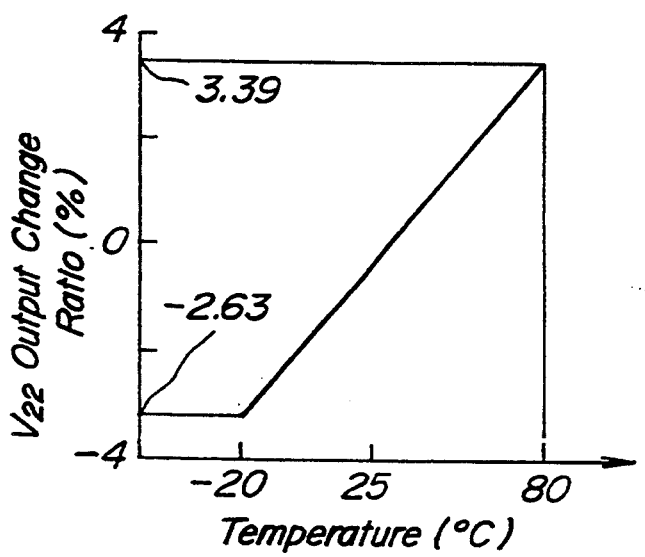
FIG._4b
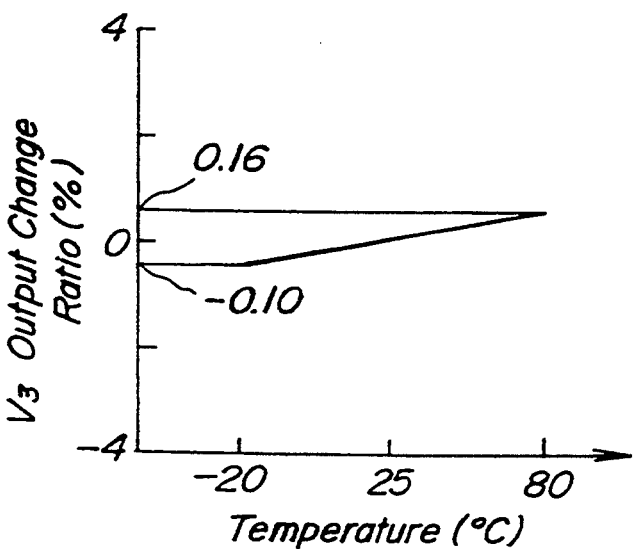
FIG._4c

FIG_5
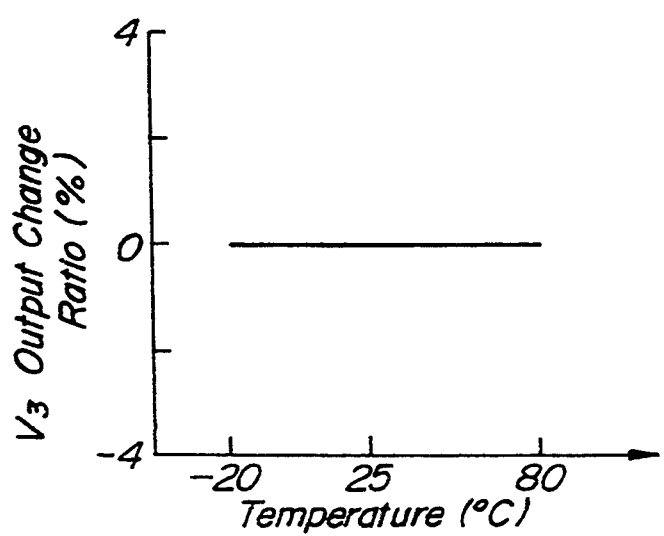

OPTICAL MAGNETIC FIELD SENSOR CAPABLE OF PRECISE MEASUREMENT WITHOUT TEMPERATURE INDUCED ERRORS

BACKGROUND OF THE INVENTION

1. Field of the Invention

The present invention relates to an optical magnetic field sensor, particularly an optical magnetic field sensor which can measure a magnetic field strength with high precision using Faraday's effect.

2. Related Art Statement

Heretofore, various structures of the optical magnetic field sensor have been known which uses Faraday's effect for measuring a magnetic field strength. As an example, JP-A-61-82,179 discloses a method of measuring a magnetic field strength capable of making the measurement with high precision wherein a light beam intensity ratio of two (P and S) polarized light beams passed through a Faraday element and emitted from an analyzer is used to correct errors resulting from light beam losses at the light beam transmission paths which are not relative to the Faraday's effect. P type polarization being defined as a light beam component which has a polarization direction parallel to a surface defined by an incident light beam which is incident to a polarizer or an analyzer and an emitted light beam emitted from the polarizer or the analyzer. S type polarization is defined by light beam component that has a polarization direction vertical to the above described surface.

In the technique of the above JP-A-61-82,179, a light beam intensity ratio (where $a = J_1/J_2$) of a P polarized light beam intensity $J_1$ to a S polarized light beam intensity $J_2$ emitted from an analyzer is preliminarily determined at the time when a magnetic field is not applied on the optical magnetic field sensor, and a treatment of regularization of signals at the time of receiving the signals when a magnetic field is applied on the optical magnetic field sensor is performed wherein the S polarized light beam intensity $J_2$ is multiplied by the above ratio a, so that the errors resulting from light beam losses at the light transmission paths can be corrected. However, the technique of JP-A-61-82,179 performs merely the treatment of regularization of signals of multiplicating $J_2$ by the above ratio a, so that signal errors resulting from temperature could not be corrected and a problem arose in that it can not be used as a highly precise optical magnetic field sensor suitable for use at large temperature change.

SUMMARY OF THE INVENTION

An object of the present invention is to obviate the above problem so as to provide an optical magnetic sensor which can measure a magnetic field strength with high precision without measuremental errors resulting from temperature change.

Another object of the present invention will become apparent from the ensuing descriptions and claims and attached drawings.

Now, the above objects can be achieved by the present invention.

The present invention is an optical magnetic field sensor, comprising a light source, a polarizer which changes a light beam emanated from the light source through an optical fiber transmission path into a linear polarized light beam, a Faraday's element which gives a Faraday's effect to the linear polarized beam depending on an applied magnetic field, an analyzer which separates the linear polarized light beam given with the Faraday's effect into a S polarized light beam and a P polarized light beam, a first light beam-receiving element which receives and changes the S polarized light beam into an electric signal $V_1$ depending on the beam intensity, a second light beam-receiving element which receives and changes the P polarized light beam into an electric signal $V_2$ depending on the beam intensity, a first calculation circuit which is supplied with the electric signal $V_1$ having a direct current component DC1 from the first light beam-receiving element to obtain an output $V_{11}$ based on an equation $V_{11} = (V_1 - DC1)/DC1$, a second calculation circuit which is supplied with the electric signal $V_2$ having a direct current component DC2 from the second light beam-receiving element to obtain an output $V_{22}$ based on an equation $V_{22} = (V_2 - DC2)/DC2$, and a third calculation circuit which is supplied with the outputs $V_{11}$ and $V_{22}$ to generate an output $V_3$ based on an equation $V_3 = 1/(\alpha/V_{11} + \beta/V_{22})$ when the product of $V_{11} \times V_{22}$ is a positive value or an equation $V_3 = 1/(\alpha/V_{11} - \beta/V_{22})$ when the product of $V_{11} \times V_{22}$ is a negative value wherein $\alpha$ and $\beta$ are constants and $\alpha + \beta = 1$, the output $V_3$ of the third calculation circuit being a decisive value for obtaining a magnetic field strength.

The optical magnetic field sensor of the present invention has the structure as mentioned above of adding the third calculation circuit to the structure of an optical magnetic field sensor which is substantially the same with conventional ones, so that measuremental errors caused by losses in the light beam paths are excluded by the treatment of regularization of the signals, and measuremental errors caused by temperature change are excluded from the signals from the first and second calculation circuits by the calculation at the third calculation circuit. Therefore, a magnetic field strength can be measured with high precision.

BRIEF DESCRIPTION OF THE DRAWING

For a better understanding of the present invention, reference is made to the accompanying drawings, in which:

FIG. 1 is a schematic block diagram showing a structure of an embodiment the optical magnetic field sensor of the present invention;

FIG. 2 is a schematic block diagram showing a structure of an optical magnetic field sensor of a comparative example;

FIGS. 3a, 3b and 3c are characteristic graphs of the present optical magnetic field sensor showing an example of temperature characteristic property relative $V_{11}$ output change ratio, $V_{22}$ output change ratio, and $V_3$ output change ratio, respectively.

FIGS. 4a, 4b and 4c is a characteristic graph of the present optical magnetic field sensor showing another example of temperature characteristic property relative to $V_{11}$ output change ratio, $V_{22}$ output change ratio, and $V_3$ output change ratio, respectively; and FIG. 5 is a characteristic graph of the present optical magnetic field sensor showing still another example of temperature characteristic property relative to $V_{11}$ output change ratio, $V_{22}$ output change ratio, and $V_3$ output change ratio, respectively.

Numbering in the Drawings

1 . . . light source
2 . . . optical fiber
3 . . . rod lens

4 ... polarizer
5 ... Faraday's element
6 ... analyzer
7 ... first rod lens
8 ... first optical fiber
9 ... first light beam-receiving element
10 ... first calculation circuit
11 ... second rod lens
12 ... second optical fiber
13 ... second light beam-receiving element
14 ... second calculation circuit
15 ... third calculation circuit
16 ... mirror

DESCRIPTION OF THE PREFERRED EMBODIMENTS

Hereinafter, the present invention will be explained in more detail with reference to examples.

Example 1

Referring to FIG. 1 showing a structure of an embodiment of the present optical magnetic field sensor, reference numeral 1 is a light source made of LED, 2 is an optical fiber forming a light beam transmission path, 3 is a rod lens which causes distributed light beams to parallel light beams, 4 is a polarizer which makes a light beam to a linear polarized light beam, 5 is a Faraday's element made of $Bi_{12}SiO_{20}$ which causes the linear polarized light beam to rotate to give Faraday's effect depending on a given magnetic field strength, and 6 is an analyzer which separates a given linear polarized light beam into a S polarized light beam and a P polarized light beam.

In addition, reference numeral 7 is a first rod lens for condensing parallel light beams of the analyzer 6, 8 is a first optical fiber forming a light beam transmission path, 9 is a first light beam-receiving element made of a photodiode for converting the S polarized light beam into an electric signal depending the strength thereof, 10 is a first calculation circuit for calculating and multiplicating the converted electric signal to exclude measuremental errors and the like resulting from losses in the light beam path, 11 is a second rod lens for condensing parallel light beams of the P polarized light beams separated at the analyzer 6, 12 is a second optical fiber forming a light beam transmission path, 13 is a second light beam receiving element made of a photodiode for converting the P polarized light beam into an electric signal depending on the strength thereof, and 14 is a second calculation circuit for calculating and multiplicating the converted electric signal to exclude measuremental errors and the like resulting from losses in the light beam path. The multiplication ratio in the first calculation circuit 10 is equal to that in the second calculation circuit 14.

The structure just described above is substantially the same with the prior optical magnetic field sensor, however a characteristic feature of the present invention is the provision of a third calculation circuit 15 which is supplied with the outputs from the first and second calculation circuits 10, 14 to perform a desired calculation so as to exclude measuremental errors resulting from temperature change. That is, the third calculation circuit 15 is supplied with the output $V_{11}$ from the first calculation circuit 10 and the output $V_{22}$ from the second calculation circuit 14, the outputs $V_{11}$ and $V_{22}$ being optionally reversed and multiplicated, to calculate and obtain the output $V_3$ based on the equation $V_3 = 1/(\alpha/V_{11} + \beta/V_{22})$ when the product of $V_{11} \times V_{22}$ is a positive value or the equation $V_3 = 1/(\alpha/V_{11} - \beta/V_{22})$ when the product of $V_{11} \times V_{22}$ is a negative value wherein $\alpha$ and $\beta$ are constants and $\alpha + \beta = 1$.

Hereinafter, modes of operation of the present optical magnetic field sensor of the aforementioned structure at the respective calculation circuit will be explained.

When the wave length of the light beam emanated from the light source 1 is taken as 850 nm, the length l of an element of a single crystal $Bi_{12}SiO_{20}$ is taken as l=4.02 mm, and the intensity of the incident light beam from the light source 1 is taken as $I_0$, the intensities $I_1$, $I_2$ of the output light beams at the first and second light beam-receiving elements 9, 13 are expressed by the following formula:

$$I_1 = I_0/2\{l - 2\Delta\phi_0\Delta Tl - 2(V_e + \Delta V_e\Delta T)Hl\} \tag{1}$$

$$I_2 = I_0/2\{l + 2\Delta\phi_0\Delta Tl + 2(V_e + \Delta V_e\Delta T)Hl\} \tag{2}$$

wherein
- $\Delta\phi_0$ : Temperature change ratio of natural light rotational ability
- $\Delta T$ : Temperature variation from 25° C.
- l : Length of the single crystal element
- $V_e$ : Verdet's constant
- $\Delta V_e$ : Verdet's constant temperature change ratio
- H : Alternate current magnetic field strength In the first and second calculation circuits 10, 14, the circuits are supplied with the electric signals $V_1$, $V_2$ from the first and second light beam-receiving elements 9, 13, respectively, the electric signal $V_1$ and $V_2$ having respective direct current components DC1 and DC2, to obtain the outputs $V_{11}$ and $V_{22}$ of the following formula based on the equations of $V_{11} = (V_1 - DC1)/DC1$ and $V_{22} = (V_2 - DC2)/DC2$.

$$V_{11} = -2(V_e + \Delta V_e\Delta T)Hl/(1 - 2\Delta\phi_0\Delta Tl) \tag{3}$$

$$V_{22} = 2(V_e + \Delta V_e\Delta T)Hl/(1 + 2\Delta\phi_0\Delta Tl) \tag{4}$$

In this case, if $V_3$ is defined as $V_3 = 1/(\alpha/V_{11} - \beta/V_{22})$ and $\alpha + \beta = 1$, the following formula (5) can be obtained.

$$V_3 = -2(V_e + \Delta V_e\Delta T)Hl/\{1 - 2(2\alpha - 1)\Delta\phi_0\Delta Tl\} \tag{5}$$

Therefore, in order that the output $V_3$ expressed by the formula (5) is not dependent on temperature, it is only necessary to fulfill the following formula (6).

$$V_3(\Delta T) = V_3(\Delta T = 0) \tag{6}$$

Accordingly, a value $\alpha$ of $\alpha = (1 - \Delta V_e/2V_e\Delta\phi_0\Delta Tl)/2$ is obtained to derive values of $\alpha = 0.6805$ and $\beta = 0.3195$ in this embodiment.

Considering that $V_{11}$ and $V_{22}$ are obtained as positive values in practice, the output $V_3$ of the third calculation circuit 15 is newly defined as: $V_3 = 1/(\alpha/V_{11} + \beta/V_{22})$, wherein $\alpha + \beta = 1$.

Example 2

Three types of optical magnetic field sensor consisting of an embodiment of the present invention of the above structure, the comparative example of the structure as shown in FIG. 2 and a prior example of JP-A-61-82179 as explained above were actually prepared to obtain a relation between the magnetic field strength and the output, output change due to change of the amount of the light beam, and output change due to temperature change. As a result, the following data as shown in the following Table 1 were obtained to ascertain that the output $V_3$ can be measured in proportion with the alternate current magnetic field strength H in the embodiment of the present invention without depending on output changes due to change of the amount of the light beam or loss in the light transmission path and change of temperature as compared with the comparative example and the prior example.

Moreover, in the embodiment of the present invention, the temperature of the sensor was varied in a range of $-20°$ C. through $80°$ C., and output change ratios relative to the output at $25°$ C. were measured to evaluate the temperature characteristic property of the present sensor. The results are shown in FIGS. 3a–3c. As seen from FIGS. 3a–3c, it can be understood that the output $V_3$ of the third calculation circuit 15 which is a characteristic feature of the present invention was not at all influenced by temperature change, even when the outputs $V_{11}$ and $V_{22}$ of the first and second calculation circuits 9, 13 were influenced by the temperature change.

TABLE 1

| | Item | | |
|---|---|---|---|
| Example | Relation between magnetic field strength and output | Output change due to change of light beam amount | Output change due to temperature change |
| Comparative | Proportional | None | Yes |
| Prior | Proportional | None | Yes |
| Invention | Proportional | None | None |

Though the temperature characteristic property in the above embodiment is not always 0% at the values of the constants $\alpha=0.6805$ and $\beta=0.3195$ due to errors in the element length and errors resulting from increasement of the effective element length caused by oblique bonding of the elements, however, even in such a case, the temperature characteristic property can be made 0%, if the constants $\alpha$, $\beta$ are deductively derived from actually measured temperature characteristic properties of $V_{11}$ and $V_{22}$ and the thus obtained optimum $\alpha$, $\beta$ are used to the outputs treatment or regularization of the signals at the third calculation circuit 15.

For instance, in case when the element length l is short resulting from an error or the like and the temperature characteristic properties of $V_{11}$ and $V_{22}$ are as shown in FIGS. 4a and 4b, the temperature characteristic property of the output $V_3$ changes as shown in FIG. 4c, if the above values are treated in the third calculation circuit 15 using the values of $\alpha=0.6805$ and $\beta=0.3195$. Then, from the outputs $V_{11}$ and $V_{22}$ at $-20°$ C. and the outputs $V_{11}$ and $V_{22}$ at $80°$ C., the constants $\alpha$, $\beta$ are deductively derived as follows, namely from the formula (7).

$$\alpha/V_{11}(-20° \text{ C.}) + \beta/V_{22}(-20° \text{ C}) = \alpha/V_{11}(80° \text{ C.}) + \beta/V_{22}(80° \text{ C.}) \quad (7)$$

As a result, in the embodiment wherein the element length is shorter than normal one, values of $\alpha=0.7222$ and $\beta=0.2778$ were obtained which gave the temperature characteristic property $V_3$ as shown in FIG. 5 by the outputs treatment, showing clearly that the outputs can be treated in the third calculation circuit 15 by using the deductively derived values of $\alpha$, $\beta$.

As clearly apparent from the foregoing explanations, according to the present invention, the present optical magnetic field sensor can achieve measurements of a magnetic field strength with high precision, because it has further the third calculation circuit in addition to the structure of the optical magnetic field sensor having substantially the same structure as that of conventional one thereby to exclude measuremental errors caused by temperature change from the outputs obtained from the first and second calculation circuits by virtue of the determined the outputs treatment at the third calculation circuit. Moreover, measuremental errors caused by change of the amount of the light beam emanated from the light source and losses in the light beam transmission paths can be excluded because it performs calculations for regularization of the outputs at the first and second calculation circuits in the same fashion as in conventional ones.

Although the present invention has been explained with specific examples and numeral values, it is of course apparent to those skilled in the art that various changes and modifications are possible without departing from the broad spirit and aspect of the present invention as defined in the appended claims.

What is claimed is:

1. An optical magnetic field sensor, comprising a light source, a polarizer which changes a light beam emanated from the light source through an optical fiber transmission path into a linear polarized light beam, a Faraday's element which gives a Faraday's effect to the linear polarized beam depending on an applied magnetic field, an analyzer which separates the linear polarized light beam given with the Faraday's effect into a S polarized light beam and a P polarized light beam, a first light beam-receiving element which receives and changes the S polarized light beam into an electric signal $V_1$ depending on the beam intensity, a second light beam receiving element which receives and changes the P polarized light beam into an electric signal $V_2$ depending on the beam intensity, a first calculation circuit which is supplied with the electric signal $V_1$ having a direct current component DC1 from the first light beam-receiving element to obtain an output $V_{11}$ based on an equation $V_{11}=(V_1-DC1)/DC1$, a second calculation circuit which is supplied with the electric signal $V_2$ having a direct current component DC2 from the second light beam-receiving element to obtain an output $V_{22}$ based on an equation $V_{22}=(V_2-DC2)/DC2$, and a third calculation circuit for providing compensation for temperature changes, wherein the third calculation circuit is supplied with the outputs $V_{11}$ and $V_{22}$ to generate an output $V_3$ based on an equation $V_3=1/(\alpha/V_{11}+\beta/V_{22})$ when the product of $V_{11} \times V_{22}$ is a positive value or an equation $V_3=1(\alpha/V_{11}-\beta/V_{22})$ when the product of $V_{11} \times V_{22}$ is a negative value, wherein $\alpha$ and $\beta$ are constants and $\alpha+\beta=1$, the output $V_3$ of the third calculation circuit being a decisive value for obtaining a magnetic field strength.

2. The optical magnetic field sensor of claim 1, wherein optimum values of $\alpha$, $\beta$ are deductively derived from temperature characteristic properties of the measured values of $V_{11}$ and $V_{22}$ at different temperature $T_1$ and $T_2$ in accordance with an equation $\alpha/V_{11}(T_1)+\beta/V_{22}(T_1)=\alpha/V_{11}(T_2)+\beta/V_{22}(T_2)$.

* * * * *